United States Patent
De Jong et al.

(10) Patent No.: US 10,379,443 B2
(45) Date of Patent: Aug. 13, 2019

(54) RADIATION SOURCE DEVICE, LITHOGRAPHIC APPARATUS AND DEVICE MANUFACTURING METHOD

(71) Applicant: ASML Netherlands B.V., Veldhoven (NL)

(72) Inventors: Arjen Teake De Jong, Apeldoorn (NL); Robertus Wilhelmus Veltman, Wijchen (NL); Reinier Theodorus Martinus Jilisen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 220 days.

(21) Appl. No.: 15/037,024

(22) PCT Filed: Dec. 8, 2014

(86) PCT No.: PCT/EP2014/076851
§ 371 (c)(1),
(2) Date: May 16, 2016

(87) PCT Pub. No.: WO2015/086510
PCT Pub. Date: Jun. 18, 2015

(65) Prior Publication Data
US 2016/0252821 A1  Sep. 1, 2016

(30) Foreign Application Priority Data
Dec. 9, 2013  (EP) ..................... 13196309

(51) Int. Cl.
*G03F 7/20* (2006.01)
*H05G 2/00* (2006.01)

(52) U.S. Cl.
CPC ...... *G03F 7/70033* (2013.01); *G03F 7/70058* (2013.01); *G03F 7/70175* (2013.01);
(Continued)

(58) Field of Classification Search
CPC ............ G03F 7/70033; G03F 7/70058; G03F 7/70175; G03F 7/70916; G03F 7/70933; H05G 2/005; H05G 2/008
See application file for complete search history.

(56) References Cited

U.S. PATENT DOCUMENTS 7,476,886 B2  1/2009  Bykanov et al.
7,872,245 B2  1/2011  Vaschenko et al.
(Continued)

FOREIGN PATENT DOCUMENTS

EP  2 170 021  4/2010
JP  2004-501491  1/2004
(Continued)

OTHER PUBLICATIONS

International Search Report and Written Opinion dated Mar. 24, 2015 in corresponding International Patent Application No. PCT/EP2014/076851.
(Continued)

*Primary Examiner* — Steven Whitesell Gordon
(74) *Attorney, Agent, or Firm* — Pillsbury Winthrop Shaw Pittman LLP

(57) ABSTRACT

A radiation source, e.g. for EUV for use in a lithographic apparatus, generates radiation by illuminating droplets of fuel with first radiation to form a plasma and collects second radiation omitted by the plasma using a collector (CO). The collector has an aperture and the fuel passes along a vertical trajectory through that aperture before being irradiated by the first radiation. In an embodiment the first radiation is directed along a beam, the final part of which is coincident with the final part of the trajectory of the fuel droplets. In an embodiment a gas flow is arranged coincident with the fuel trajectory and/or the beam of first radiation.

18 Claims, 10 Drawing Sheets

(52) U.S. Cl.
CPC ...... *G03F 7/70916* (2013.01); *G03F 7/70933* (2013.01); *H05G 2/005* (2013.01); *H05G 2/008* (2013.01)

(56) References Cited

U.S. PATENT DOCUMENTS

| | | | |
|---|---|---|---|
| 8,304,752 B2 | 11/2012 | Fomenkov et al. | |
| 8,901,521 B2 | 12/2014 | Van Empel et al. | |
| 2002/0014598 A1 | 2/2002 | Melnychuk et al. | |
| 2002/0014599 A1 | 2/2002 | Rauch et al. | |
| 2003/0020890 A1 | 1/2003 | Ogushi et al. | |
| 2005/0167618 A1* | 8/2005 | Hoshino | B82Y 10/00 250/504 R |
| 2005/0199829 A1* | 9/2005 | Partlo | B82Y 10/00 250/504 R |
| 2005/0205803 A1* | 9/2005 | Mizoguchi | B82Y 10/00 250/492.2 |
| 2005/0225739 A1* | 10/2005 | Hiura | B82Y 10/00 355/67 |
| 2006/0249698 A1* | 11/2006 | Endo | G03F 7/70916 250/504 R |
| 2008/0073598 A1* | 3/2008 | Moriya | H05G 2/001 250/504 R |
| 2009/0090877 A1 | 4/2009 | Van Empel et al. | |
| 2009/0230326 A1 | 9/2009 | Vaschenko et al. | |
| 2009/0250639 A1* | 10/2009 | Banine | G03F 7/70033 250/503.1 |
| 2010/0039631 A1* | 2/2010 | Loopstra | G03F 7/70033 355/67 |
| 2010/0051832 A1 | 3/2010 | Nishisaka et al. | |
| 2010/0140513 A1* | 6/2010 | Nagai | G03F 7/70033 250/504 R |
| 2010/0327192 A1* | 12/2010 | Fomenkov | H01S 3/2232 250/504 R |
| 2011/0188014 A1* | 8/2011 | Banine | G03F 7/70033 355/30 |
| 2011/0309260 A1* | 12/2011 | Nishisaka | G03B 27/54 250/372 |
| 2012/0313016 A1* | 12/2012 | Fleurov | H05G 2/005 250/504 R |
| 2012/0327381 A1 | 12/2012 | Labetski et al. | |
| 2014/0319387 A1* | 10/2014 | Kim | H05G 2/006 250/504 R |

FOREIGN PATENT DOCUMENTS

| | | |
|---|---|---|
| JP | 2010-123928 | 3/2010 |
| JP | 2013-522866 | 6/2013 |
| WO | 2009/025557 | 2/2009 |

OTHER PUBLICATIONS

Japanese Office Action issued in Japanese Patent Application No. 2016-537962, dated Oct. 16, 2018.

* cited by examiner

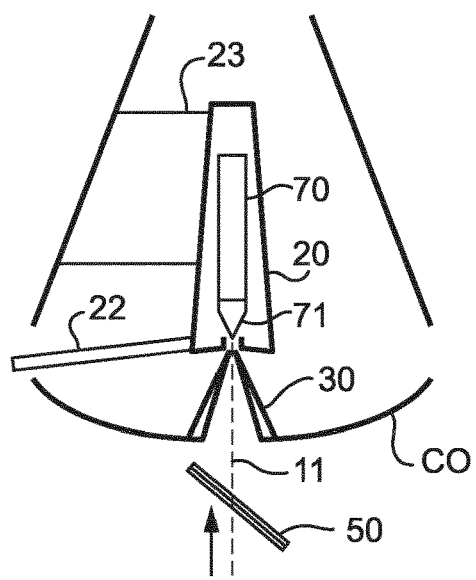
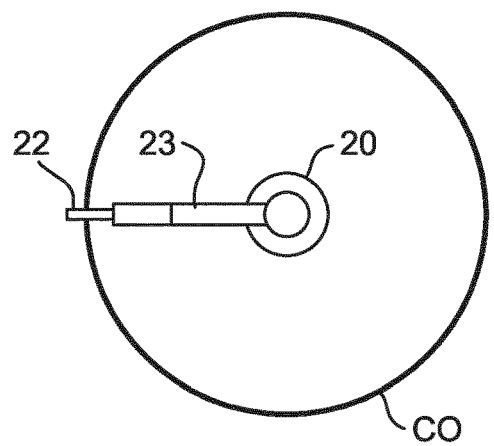
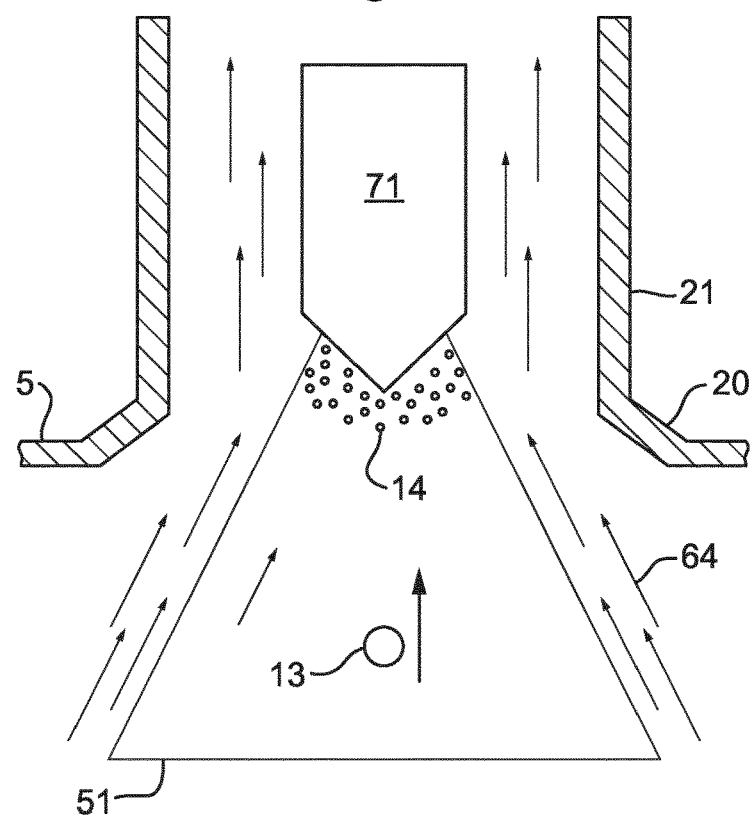

RADIATION SOURCE DEVICE, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2014/076851, which was filed on Dec. 8, 2014, which claims the benefit of priority of European patent application no. 13196309.2, which was filed on Dec. 9, 2013, and which is incorporated herein in its entirety by reference.

FIELD

The present invention relates to a radiation source device, a lithographic apparatus and a device manufacturing method. In particular, the invention relates to radiation sources for generating EUV radiation for lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to reduce the size of the features of the circuit pattern, it is necessary to reduce the wavelength of the imaging radiation. To this end, lithographic apparatus using EUV radiation, e.g. having a wavelength in the range of from about 5 nm to 20 nm, are under development. EUV radiation is strongly absorbed by almost all materials, therefore the optical systems and mask must be reflective and the apparatus kept under a low pressure or vacuum.

SUMMARY

Generation of EUV radiation of sufficient intensity and spectral purity for use in a lithographic apparatus is difficult. Possible sources include synchrotrons, free electron lasers and plasma sources of various types. Currently, the most promising source type is the laser-produced plasma source. In such a source, a small quantity of a fuel, e.g. a droplet of liquid tin, is irradiated with a powerful laser so that it forms a plasma. When free electrons in the plasma recombine with the tin ions, radiation at 13.5 nm wavelength is emitted. Although functioning tin-based LPP sources have been developed, they present various issues, in particular relating to the large amounts of debris generated which contaminates the source module and can also migrate into other parts of the lithographic apparatus. Further, there are difficulties in accurately targeting the laser on the droplets, with significant pulse-to-pulse variations in the source position and output power. Generation of sufficient power in the desired wavelength is also a major concern, given the significant losses that occur at each reflection of the EUV beam.

Therefore, it is desirable to provide an improved source for EUV radiation which avoids or ameliorates at least some of the above problems.

According to an aspect of the invention, there is provided a radiation source comprising:
  a fuel dispenser for emitting fuel along a fuel trajectory;
  a beam guiding system for directing first radiation in a first beam to a first focal point located on the fuel trajectory, whereby fuel at the focal point is excited into a plasma that emits second radiation; and
  a collector arranged to collect the second radiation and direct it in a second beam to a second focal point;
  wherein the fuel trajectory is substantially parallel to the first beam.

According to an aspect of the invention, there is provided a radiation source comprising:
  a fuel dispenser for emitting fuel along a fuel trajectory;
  a beam guiding system for directing first radiation to a first focal point located on the fuel trajectory, whereby fuel at the focal point is excited into a plasma that emits second radiation; and
  a collector arranged to collect the second radiation and direct it to a second focal point;
  wherein the collector has an aperture through which the first beam is directed and a conical wall surrounding the aperture and extending towards the first focal point.

According to an aspect of the invention, there is provided a radiation source comprising:
  a fuel dispenser for emitting fuel along a fuel trajectory;
  a beam guiding system for directing first radiation to a first focal point located on the fuel trajectory, whereby fuel at the focal point is excited into a plasma that emits second radiation; and
  a collector arranged to collect the second radiation and direct it to a second focal point;
  wherein the fuel trajectory is vertical and passes through an aperture in the collector.

According to an aspect of the invention, there is provided a lithographic apparatus comprising:
  a radiation source as described above;
  an illuminator arranged to direct the second radiation onto a patterning device;
  a support table arranged to support a patterning device; and
  a projection system arranged to project radiation patterned by the patterning device onto a substrate.

According to an aspect of the invention, there is provided a device manufacturing method comprising:
  emitting fuel on a fuel trajectory;
  irradiating the fuel with first radiation in a first beam so as to excite the fuel into a plasma;
  collecting radiation emitted by the plasma into a second beam using a collector;
  directing the collected radiation to illuminate a patterning device; and
  projecting radiation pattern by the patterning device onto a substrate; wherein
  the fuel trajectory is substantially parallel to the first beam.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 8A and B depict principal components of another source collector apparatus according to an embodiment of the invention;

FIG. 9 is an enlarged depiction of part of the source collector apparatus of FIGS. 8A and B;

DETAILED DESCRIPTION

Figure 1:
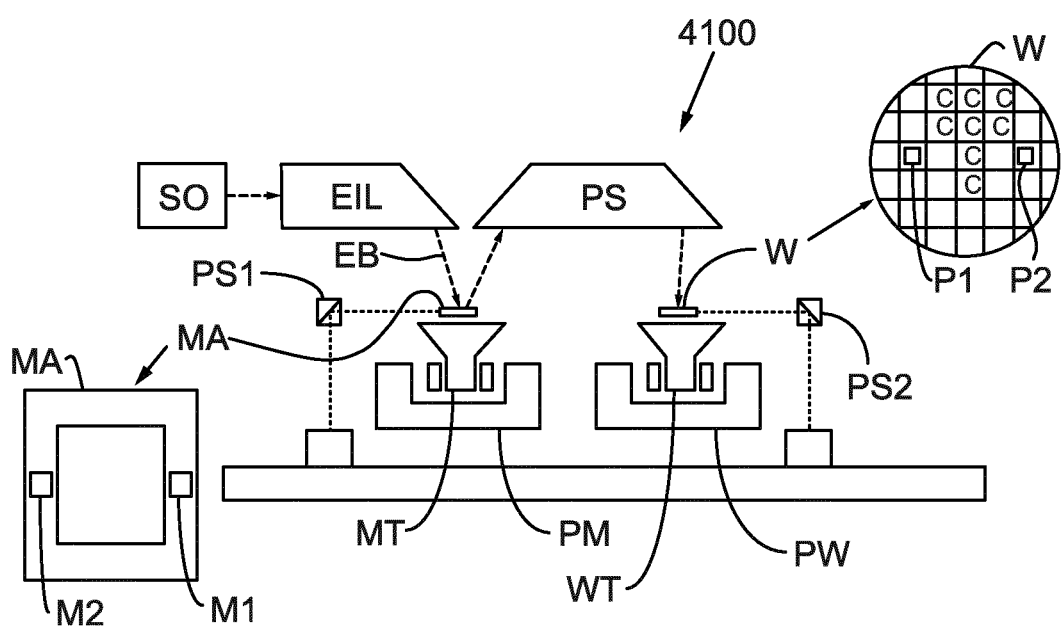
FIG. 1 depicts a lithographic apparatus used in an embodiment of the invention.

FIG. 1 schematically depicts an EUV lithographic apparatus 4100 including a source collector apparatus SO. The apparatus comprises:

an illumination system (illuminator) EIL configured to condition a radiation beam EB (e.g. EUV radiation);

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam EB by patterning device MA onto a target portion C (e.g. comprising one or more dies) of the substrate W.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least a part of one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 1, the EUV illuminator EIL receives an extreme ultraviolet radiation beam from the source collector apparatus SO. The source collector apparatus SO is described in more detail below. In outline, a material (which may be referred to as the fuel) that has at least one element, e.g., xenon (Xe), lithium (Li) or tin (Sn), with one or more emission lines in the EUV range is converted into a plasma state. This is achieved by irradiating a droplet, stream or cluster of the fuel with a laser beam. The resulting plasma emits output radiation, e.g., EUV radiation, which is collected using a radiation collector, disposed in the source collector apparatus.

Different arrangements of the parts of the radiation system are possible. For example, the laser and the source collector apparatus may be separate entities, for example when a $CO_2$ laser is used to provide the laser beam for fuel excitation. In such cases, the laser is not considered to form part of the lithographic apparatus and the radiation beam is passed from the laser to the source collector apparatus with the aid of a beam delivery system comprising, for example, suitable directing mirrors and/or a beam expander.

The EUV illuminator EIL may comprise an adjuster to adjust the angular intensity distribution of the radiation beam EB. Generally, at least the outer and/or inner radial extent (commonly referred to as σ-outer and σ-inner, respectively) of the intensity distribution in a pupil plane of the illuminator can be adjusted. In addition, the EUV illuminator EIL may comprise various other components, such as facetted field and pupil mirror devices. The EUV illuminator EIL may be used to condition the radiation beam EB, to have a desired uniformity and intensity distribution in its cross section.

The radiation beam EB is incident on the patterning device (e.g., mask) MA, which is held on the support structure (e.g., mask table) MT, and is patterned by the patterning device. After being reflected from the patterning device (e.g. mask) MA, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) MA with respect to the path of the radiation beam EB. Patterning device (e.g. mask) MA and substrate W may be aligned using mask alignment marks M1, M2 and substrate alignment marks P1, P2.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A control system (not shown) controls the overall operations of the lithographic apparatus and in particular performs an optimization process described further below. The control system can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system may also be configured to control one or more associated process devices and substrate handling devices in a lithocell or cluster of which the lithographic apparatus forms a part. The control system can also be configured to be subordinate to a supervisory control system of a lithocell or cluster and/or an overall control system of a fab.

Figure 2:
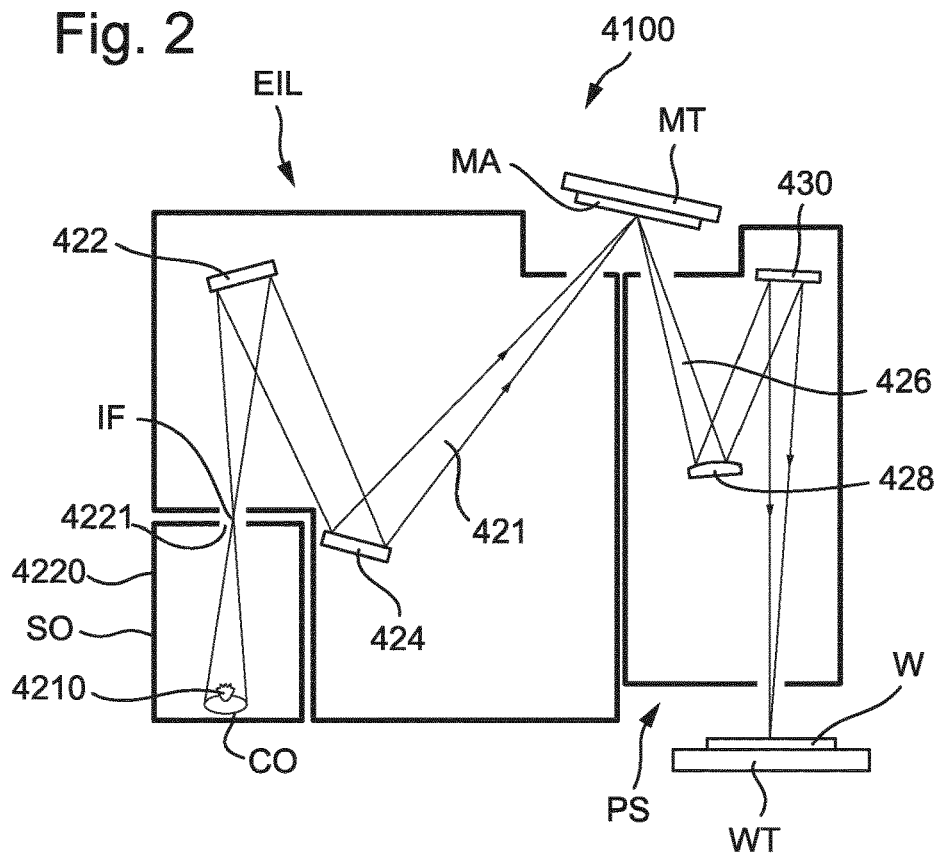
FIG. 2 is a more detailed view of the main optical path of the apparatus of FIG. 1.

FIG. 2 shows the optical path and related components of EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210, e.g. of excited tin (Sn), is generated by laser irradiation to produce EUV radiation.

A radiation collector CO collects EUV radiation emitted by the plasma 4210 and focuses it in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate stage or substrate table WT.

More elements than shown may generally be present in illumination optics unit IL and projection system PS. A spectral filter (not shown) may optionally be present, depending upon the type of lithographic apparatus. There may be more mirrors present than those shown in the Figures, for example there may be from 1 to 6 additional reflective elements present in the projection system PS than shown in FIG. 2.

In a known radiation source, droplets of molten tin as a fuel are emitted in a horizontal, or near horizontal, trajectory that passes through the primary focus of a reflective collector. A high powered laser beam is directed through a centrally located aperture in the collector and focused on the primary focus. The laser is pulsed and the pulse timing is controlled so that a pulse is directed at each droplet of fuel as it arrives at the primary focus. This causes the fuel to form a plasma which emits a UV radiation that is collected by the collector and directed into an apparatus where it is to be used, e.g. a lithographic apparatus.

A large amount of debris is generated and measures must be taken to prevent the debris entering other parts of the apparatus and contaminating the collector, which reduces its reflectivity and the efficiency of the source. Various arrangements, e.g. using static or rotating vanes, have been developed for minimizing migration of debris into other parts of the apparatus but these quickly become contaminated and absorb significant amounts of the useful radiation.

Other contamination mitigation strategies include the provision of a buffer gas, e.g. hydrogen, which serves to slow down the movement of debris and also chemically clean contaminated surfaces. However, flows of the buffer gas can deflect the droplets of fuel on their trajectory to the primary focus, making targeting the droplets with the first radiation difficult and causing positional instability in the radiation source. A shroud can be provided to shield part of the droplet trajectory from the effects of the buffer gas. However, the shroud cannot protect the entire trajectory and obstructs part of the beam of useful radiation. As well as the contamination issues with existing source designs and their limited lifetime, it would be greatly desirable to increase the power of the beam of useful radiation in order to improve throughput of a lithographic apparatus.

A first embodiment of the invention is a radiation source comprising:

a fuel dispenser for emitting fuel along a fuel trajectory;

a beam guiding system for directing first radiation in a first beam to a first focal point located on the fuel trajectory, whereby fuel at the focal point is excited into a plasma that emits second radiation; and a collector arranged to collect the second radiation and direct it in a second beam to a second focal point;

wherein the fuel trajectory is substantially parallel to the first beam.

By making the fuel trajectory substantially parallel to the first beam, the accuracy of targeting fuel droplets can be improved and the configuration of the source can be improved. For example, it becomes possible to locate a debris mitigation device behind the first focal point, close to the point of generation of the debris.

A second embodiment is based on the first embodiment and the beam guiding system is arranged to direct the first radiation to converge on the first focal point and an end part of the fuel trajectory is within the first beam. This arrangement is particularly convenient to improve targeting accuracy and allows the fuel to be preheated by the first beam before reaching the first focal point.

A third embodiment is based on the second embodiment and the end part of the fuel trajectory is substantially collinear with an optical axis of the first beam. This arrangement is most preferred to improve targeting accuracy.

A fourth embodiment is based on any of the first to third embodiments and the fuel trajectory and the first radiation pass through an aperture in the collector. The use of a single aperture to pass both the fuel and the first radiation through the collector maximizes the area of the reflector available for collecting useful radiation.

A fifth embodiment is based on the fifth embodiment and the beam guiding system comprises a mirror oriented obliquely to the fuel trajectory and the fuel trajectory passes through a second aperture in the mirror. With this arrangement, the first radiation can easily be coupled onto the fuel trajectory to be collinear therewith.

A sixth embodiment is based on any of the first to fifth embodiments and wherein the second beam is substantially parallel to the first beam. By having the first and second beam parallel to each other as well as to the fuel trajectory, the radiation source can be arranged to maximize the collection of desired radiation and coupling of that radiation into the second (output) beam.

A seventh embodiment is based on any of the first to sixth embodiments and further comprises a debris trap located behind the first focal point as seen from the collector. Because the debris trap is located behind the primary focus, the momentum of the fuel carries the debris into the trap. The debris trap can be located very close to the primary focus so that there is little time for the debris to disperse before entering the debris trap. The amount of debris in the apparatus is thereby reduced at the very outset.

An eighth embodiment is based on the seventh embodiment and the debris trap is located substantially within a volume not traversed by second radiation directed by the collector to the second focal point. This location of the debris trap ensures that it does not obstruct any useful radiation and thereby does not reduce the effective source power. The aperture in the collector necessarily creates a shadow cone in the second radiation collected by the collector in which the debris trap can be placed.

A ninth embodiment is based on the eighth embodiment and the debris trap is elongate and has a longitudinal axis, the longitudinal axis substantially lying on an optical axis of the second beam. With such an arrangement, the debris trap can be located so as to minimize the obstruction of desired radiation in the second beam.

A tenth embodiment of the invention is based on the eighth or ninth embodiment and further comprises a drain arranged to remove debris from the debris trap. The fuel debris in the debris trap can be removed simply on a continuous basis via the drain without needing down time to empty the debris trap.

An eleventh embodiment of the invention is based on any of the first to tenth embodiments and further comprises a gas supply device arranged to supply a gas to a chamber including the collector and a gas exhaust device arranged to remove gas from the debris trap. A gas, such as a buffer gas, can assist in reducing movement of debris into other parts of the source or a connected apparatus and/or can assist in cleaning any contamination of surfaces thereof. By supplying the gas to a chamber including the collector and removing it from the debris trap, a flow of gas into the debris trap is created which increases the amount of debris captured by the trap.

A twelfth embodiment is based on the eleventh embodiment and the gas supply device is arranged to supply gas to a space behind the collector viewed from the first focal point so that a gas flow through the aperture is established in use. The gas flow through the aperture, i.e. parallel to or collinear with the trajectory, helps to maintain the fuel on course and avoids buffeting thereof that might cause it to deviate from the desired trajectory.

A thirteenth embodiment is based on the eleventh or twelfth embodiment and the gas supply device includes a nozzle member around the aperture and having at least one nozzle aperture arranged to emit gas toward the first focal point. The gas emitted toward the first focal point creates a stream of gas that further assists in ensuring the fuel does not deviate from the desired trajectory and can even redirect fuel that has deviated to the correct trajectory.

A fourteenth embodiment is based on the thirteenth embodiment and the nozzle member has a plurality of nozzle apertures each arranged to emit a gas stream directed to a respective point adjacent the first focal point whereby a vortex flow of gas surrounding the first focal point can be established. The vortex flow is particularly effective in ensuring the correct trajectory for the fuel and for conveying debris into the debris trap.

A fifteenth embodiment is based on the thirteenth or fourteenth embodiment and the nozzle member is mounted to the collector.

A sixteenth embodiment is based on any of the preceding embodiments and further comprises a heat storage element located on the fuel trajectory past the first focal point. The heat source member can heat approaching fuel droplets, causing them to expand and thereby provide a larger target of the first radiation. Alternatively a fuel droplet can be shaped on contact with the heat storage element to maximize the area irradiated by the first radiation. The heat storage element can avoid the need for a pre-pulse to expand a fuel droplet.

An eighteenth embodiment is based on the sixteenth embodiment and the heat storage element is located within a debris trap. Locating the heat storage element in the debris trap avoids obstructing useful radiation ad increase the collection of debris in the trap.

A fifteenth eighteenth embodiment is based on the sixteenth or seventeenth embodiment and further comprises a temperature control system arranged to control the temperature of the heat storage element to be higher than a melting point of the fuel. The temperature control system can heat or cool the heat storage element to ensure it is at the correct temperature for effective operation.

A nineteenth embodiment is based on any one of the preceding embodiments and further comprises a wall provided on the collector around the aperture therein and extending toward the first focal point. The wall serves to assist in isolating a chamber behind the collector from a chamber in front of the collector and is useful to further control debris migration.

A twentieth embodiment is based on any one of the preceding embodiments and the fuel trajectory is vertically upward. An upward fuel trajectory enable the output beam of the radiation source to be directed upward which can be convenient for arrangement of an apparatus to which the output beam is supplied.

A twenty-first embodiment is based on any one of the preceding embodiments and the fuel dispenser is a droplet generator.

A twenty-second embodiment is based on any one of the preceding embodiments and the droplet generator is arranged to generate droplets of molten tin.

A twenty-third embodiment of the invention is a radiation source comprising:
a fuel dispenser for emitting fuel along a fuel trajectory;
a beam guiding system for directing first radiation to a first focal point located on the fuel trajectory, whereby fuel at the focal point is excited into a plasma that emits second radiation; and
a collector arranged to collect the second radiation and direct it to a second focal point;
wherein the collector has an aperture through which the first beam is directed and a conical wall surrounding the aperture and extending towards the first focal point.

The conical wall around the aperture helps to separate the space behind the collector from the space in front of the collector and so helps to control the migration of debris in the source.

A twenty fourth embodiment of the invention is a radiation source comprising:
a fuel dispenser for emitting fuel along a fuel trajectory;
a beam guiding system for directing first radiation to a first focal point located on the fuel trajectory, whereby fuel at the focal point is excited into a plasma that emits second radiation; and
a collector arranged to collect the second radiation and direct it to a second focal point;
wherein the fuel trajectory is vertical and passes through an aperture in the collector.

By providing a vertical fuel trajectory, the accuracy of the delivery of fuel to the first focal point (primary focus) can be improved, as deviations due to gravity and gas flows are reduced.

A twenty-fifth embodiment is a lithographic apparatus comprising:
a radiation source according to any one of the preceding embodiments;
an illuminator arranged to direct the second radiation onto a patterning device;
a support table arranged to support a patterning device; and
a projection system arranged to project radiation patterned by the patterning device onto a substrate.

A twenty-sixth embodiment is a device manufacturing method comprising:
emitting fuel on a vertical trajectory;
irradiating the fuel with first radiation so as to excite the fuel into a plasma;
collecting radiation emitted by the plasma using a collector having an aperture through which the fuel trajectory passes;
directing the collected radiation to illuminate a patterning device; and
projecting radiation pattern by the patterning device onto a substrate.

Figure 3A:
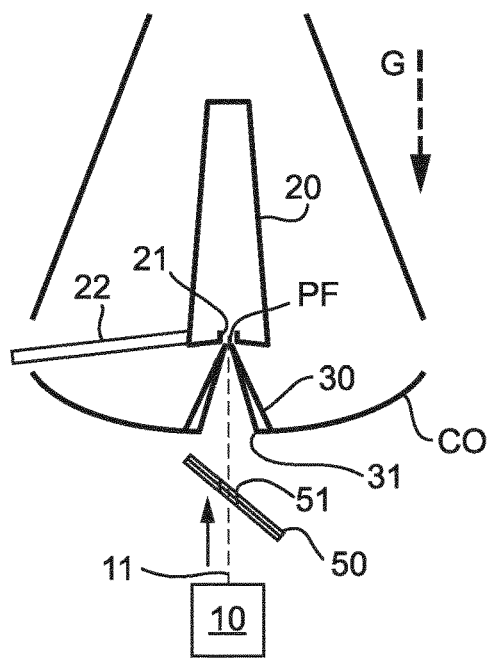
FIGS. 3A and B depict principal components of the source collector apparatus of the apparatus of FIGS. 1 and 2.
Figure 3B:
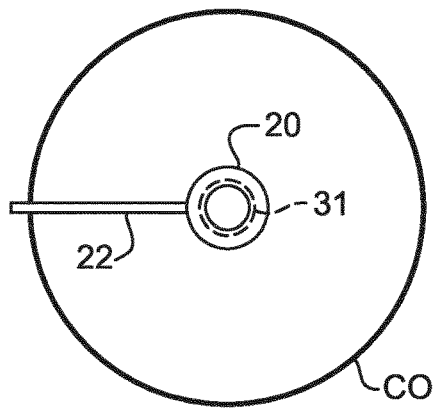

An exemplary embodiment of the present invention will now be described in more detail. FIGS. 3A and 3B show the principal components of the source collector apparatus SO in more detail. A droplet generator 10 emits droplets of fuel (e.g. molten tin) on a trajectory 11. Trajectory 11 is desirably vertical or near vertical (e.g. within 10 degrees of vertical, more desirably within 5 degrees of vertical). In an embodiment the droplets move upwardly, i.e. against the force of gravity G, along trajectory 11. Upward movement of the droplets enables the source collector apparatus SO to be more conveniently arranged for the remainder of the lithographic apparatus. In an embodiment of the apparatus the droplets move downwardly, i.e. with the force of gravity. Downward movement can allow the droplets to be emitted at a lower initial velocity and can improve collection of debris as discussed further below. The droplets are emitted at an initial velocity in the range of 10 $ms^{-1}$ to 200 $ms^{-1}$, desirably in the range of from about 30 $ms^{-1}$ to about 150 $ms^{-1}$. Each droplet desirably has a diameter in the range of from 10 μm to 50 μm, desirably about 30 μm. Suitable droplet generators are known in the art and can readily be adapted to emit droplets on the desired trajectory.

Trajectory 11 of the fuel droplets passes through an aperture 31 in collector CO to reach a first focal point PF, sometimes referred to as a primary focus. At the primary focus PF the fuel droplets are irradiated by first radiation, e.g. light emitted by a $CO_2$ excimer laser (not shown in FIG. 3A). A mirror 50 directs a convergent beam of the first radiation so that it converges at the primary focus PF. Mirror 50 can be flat with other optical elements provided to create the converging beam or can have an optical power to assist in converging the first radiation. An aperture 51 is provided in mirror 50 for the droplets of fuel to pass through. Trajectory 11 can be located so that it passes to the side of mirror 50 or through a notch in the edge of mirror 50. The first radiation is generated by a pulsed source. Arrangements to ensure that pulses of the first radiation occur at the appropriate timing to be coincident with arrival of a droplet at the primary focus are known.

Droplets of the fuel irradiated at the primary focus by the first radiation receive sufficient energy to be excited into a plasma state. The plasma state then emits radiation through recombination of electrons and ions, including EUV radiation at a desired wavelength. The EUV radiation is emitted in all directions. A part of the emitted radiation is collected by collector CO, which in an embodiment is a near normal reflector formed by a multilayer stack acting as a distributed Bragg reflector provided on a suitably curved substrate. The radiation collected by collector CO is directed to a second focal point, referred to as the intermediate focus IF.

Beyond the primary focus along the trajectory 11, a debris trap 20 is provided. Debris trap 20 has an opening 21 adjacent the prime focus. The plasma generated by irradiation of fuel droplet generates a large amount of physical debris in the form of free electrons, ions, neutral atoms and larger particles of the fuel material which have either re-condensed after emission of EUV or were not fully ionized. This expanding cloud of debris retains overall the momentum of the original fuel droplet and the majority of the debris enters the debris trap 20. The debris condenses within the debris trap, e.g. on the internal walls thereof, and runs down towards the base. A wall is provided around aperture 21 to prevent condensed debris exiting aperture 21. A drain 22 is provided at the lower end of debris trap 20 to conduct away condensed debris. To assist draining of debris the interior of debris trap 20 and drain 22 are maintained at a temperature above the melting point of the fuel. In an embodiment this can be achieved through the heat input from the first radiation. In an embodiment, heaters—e.g. electric heaters—are provided to maintain the interior of debris trap 20 and drain 22 at the necessary temperature.

Figure 4:
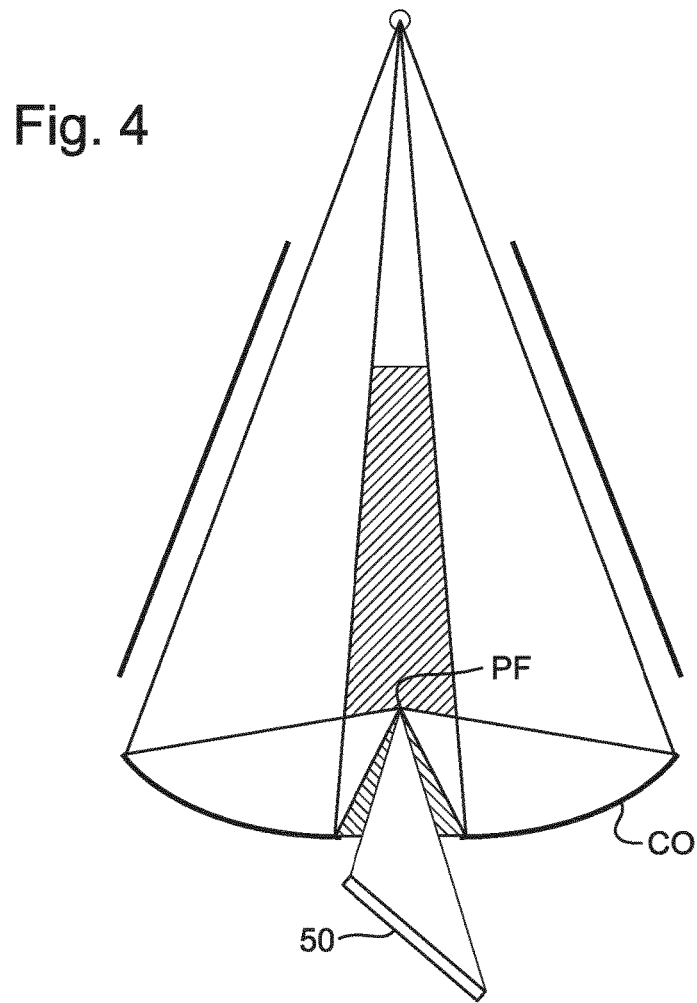
FIG. 4 depicts the beam path of EUV radiation in the source collector apparatus of the apparatus of FIGS. 3A and B.

It is desirable that the debris trap not obstruct or obstruct as little as possible of the EUV radiation collected by collector CO and directed to intermediate focus IF. To this end, the debris trap 20 is located substantially within a space in the center of the cone of the second radiation that is in effect in the shadow of the aperture 31 in collector CO. The shadow is shown by hatching in FIG. 4. In an embodiment, the debris trap 20 has the form of a cone, e.g. a truncated cone, that tapers towards the intermediate focus IF. In an embodiment, the debris trap is elongate and has a longitudinal axis which is collinear with the optical axis of the collector CO and the beam of EUV radiation directed to the intermediate focus IF.

The drain 22 crosses the path of radiation collected by the collector and directed to the intermediate focus and therefore it is desirable that its width in a plane perpendicular to the optical axis of the second radiation is as small as possible. In an embodiment, the drain 22 additionally functions to support debris trap 20. In an embodiment an additional support for debris trap 20 is provided in the shadow of drain 22.

A conical wall 30 is provided around the aperture 31 and projects towards the primary focus PF. Conical wall 30 tapers towards primary focus PF and in an embodiment its thickness also reduces towards primary focus PF. Conical wall 30 functions to assist in separating the space above the collector in which the plasma is formed from the space below or behind the collector CO. It therefore serves to reduce migration of debris to the chamber behind collector CO and reduces contamination of mirror 50 and other components. The space behind collector CO can be referred to as the source chamber and the space above collector CO can be regarded as the collector chamber. Desirably, to minimize contamination outside the collector chamber these two chambers are isolated from each other as far as possible. Since the plasma occupies only a small volume, e.g. having a diameter of about 100 μm or less than 200 μm, when emitting EUV, only a narrow annular gap between conical wall 30 and debris trap 20 is necessary to allow the EUV radiation to reach the collector CO. Desirably the gap between conical wall 30 and debris trap 20 is as small as possible without obstructing useful EUV radiation in order to minimize the amount of debris and unwanted radiation that reaches other parts of the apparatus. Conical wall 30 can be implemented in a radiation source having a different arrangement than described herein. Conical wall 30 is useful independently of other features of the present invention.

Figure 5A:
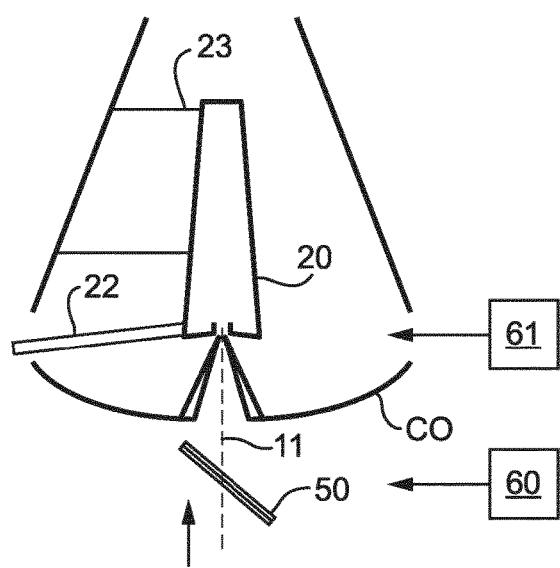
FIGS. 5A and B depict principal components of another source collector apparatus according to an embodiment of the invention.
Figure 5B:
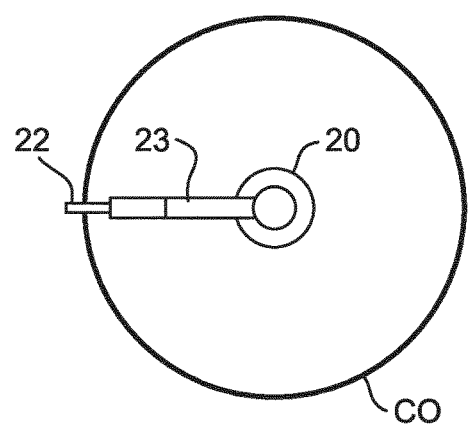
Figure 6:
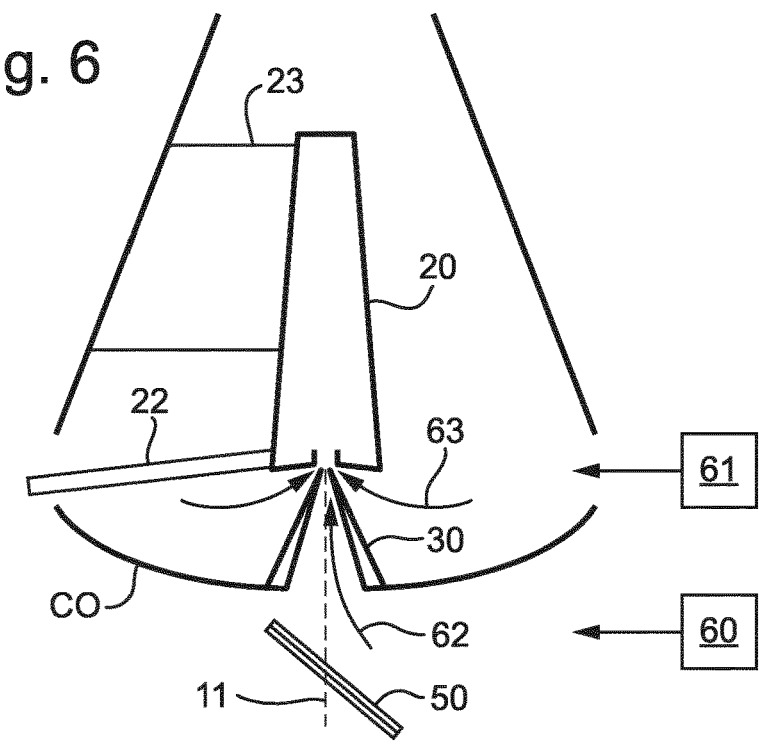
FIG. 6 depicts gas flow in the source collector apparatus of FIGS. 5A and B.

FIGS. 5A, 5B and 6 illustrate a second embodiment of the source collector apparatus of the present invention. Parts of the second embodiment that are the same as or correspond to parts of the first embodiment are identified with like references. Only aspects of the second embodiment which differ from the first embodiment are described below.

In the second embodiment, a gas is supplied to the source chamber and/or the collector chamber to assist in mitigation of the transport of debris and/or cleaning of contaminated surfaces such as the reflective surface of collector CO. The gas can be hydrogen (especially if a cleaning function is desired), helium, argon or another inert gas. Hydrogen can be provided in the form of $H_2$ gas which is converted to H radicals by the first and second radiation. FIG. 5A shows gas supply 60 supplying gas to the source chamber and gas supply 61 supplying gas to the collector chamber. In an embodiment, a single gas supply supplies gas to only one of the two chambers. In an embodiment, a single gas supply supplies a gas to both of the gas chambers.

An exhaust duct 23 is provided to remove gas from the interior of the debris trap 20. Desirably exhaust duct 23 is provided substantially in the shadow of drain 22. Exhaust duct 23 can additionally function to support or assist in support of, debris trap 20. In an embodiment exhaust duct 23 and drain 22 are combined. In an embodiment, drain 22 and exhaust 23 are oriented vertically to assist in draining fuel debris from the debris trap.

Gas can be supplied to one or both chambers in a total amount in the range of from 10 to 250 standard liters per minute (sL/min), desirably less than 100 sL/m, more desirably less than 50 sL/min A suitable rate of gas supply is determined by the desired gas flow rate to be achieved in the opening to the debris trap and the size of that opening. Gas is exhausted through exhaust duct 23 at substantially the same rate as it is supplied so that the gas pressure in the collector chamber is maintained in the range of from about 100 Pa to about 200 Pa. The above figures are particularly suitable where the gas is hydrogen, different values may be appropriate for other gasses.

The gas supply and exhaust arrangements of the second embodiment result in gas flows as indicated in FIG. 6. A gas flow 62 passes along trajectory 11 from the source chamber to the collector chamber through the interior of conical wall 30. The gas passes the primary focus and enters debris trap 20 from which it is exhausted via exhaust duct 23. Gas supplied to the collector chamber circulates around the reflective face of collector CO and forms a gas flow 63 that enters debris trap 20 through the annular gap between conical wall 30 and debris trap 20. In an embodiment of the invention, the gas flow rates and the geometry of the apparatus are arranged such that the gas flow velocity in gas flow 62 and/or gas flow 63 is greater than 50 ms$^{-1}$, desirably greater than 75 ms$^{-1}$, desirably greater than 100 ms$^{-1}$. The gas flows into debris trap 20 serve to assist in collection of debris from the plasma and substantially reduces the amount of debris that enters the collector chamber. Gas flow 62 can be generated by a pressure difference between the source chamber and the collector chamber or debris trap or by entrainment with gas flowing into the debris trap from the collector chamber or a combination of both effects.

Figure 7:
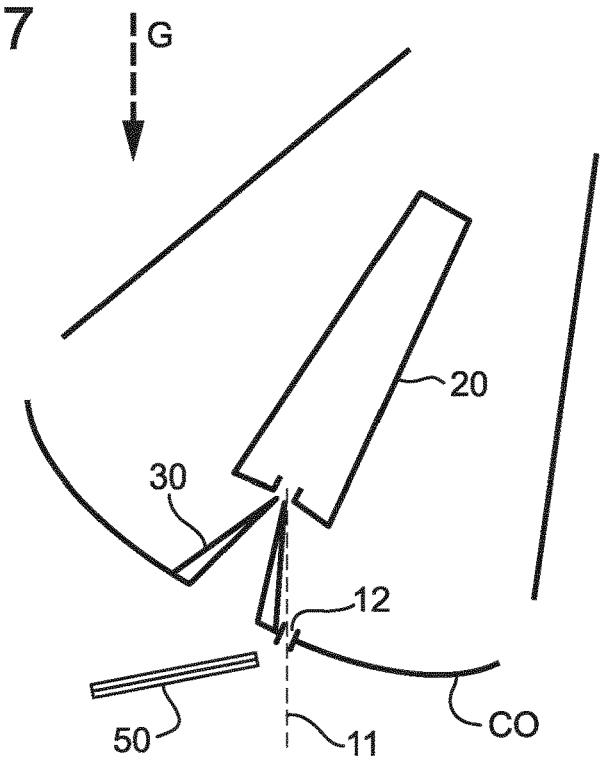
FIG. 7 depicts principal components of another source collector apparatus according to an embodiment of the invention.

FIG. 7 depicts a third embodiment of the present invention. Parts of the third embodiment that are the same as or correspond to parts of the first and second embodiment are indicated by the same references. Only differences are described below.

The third embodiment is tilted so as to provide an output beam at an angle to the vertical. This can provide advantages in layout of the rest of the apparatus. Although the rest of the source collector apparatus is tilted as compared to the first and second embodiment, the trajectory 11 remains vertical. A small aperture 12 is provided in collector CO for the fuel to pass through. This aperture need only be very small and does not significantly reduce the radiation collected into the output beam. If necessary, a part of conical wall 30 can be cut away near debris trap 20.

FIGS. 8A, 8B and 9 depict a fourth embodiment of the present invention. Parts of the fourth embodiment that are the same as or correspond to parts of the previous embodiments are identified with like references. Only differences are described below.

In the fourth embodiment, a heat storage element 70 is provided within the debris trap 20. Heat storage element 70 has a tip portion 71 close to the entrance to the debris trap 20 and the primary focus PF. In an embodiment, tip 71 is placed at the primary focus. Tip 71 of the heat storage element 70 is heated by the first radiation and desirably reaches a heat substantially in excess of the melting point of the fuel. In an embodiment, an additional heating mechanism, e.g. an electric heater is provided to heat the heat storage element 70 to the desired temperature. Even if the heat delivered by the first radiation is sufficient to maintain the heat storage element at the correct temperature during steady state operation, a heater can be useful to bring the heat storage element to the correct temperature quickly at start up. In an embodiment of the invention a droplet 13 of fuel approaching heat storage element tip 71 is heated.

Several mechanisms can be employed to heat the approaching droplet 13. One mechanism is sputtering or spitting of particles 14 from fuel accumulating on tip 71 from previous droplets. In the case of tin as the fuel and hydrogen gas as the buffer gas it has been found that hydrogen induces bubbling within fuel condensed on tip 71 and hot particles are emitted when those bubbles burst. Another mechanism for heating approaching fuel droplets 13 is infrared radiation emitted by tip 71. Heating fuel droplets 13 as they approach the primary focus has the effect of causing the droplet to expand, potentially into a mist. An expanded droplet forms a larger target for the pulse of the first radiation, increasing energy transfer into the fuel and thereby increasing efficiency. The pre-heating of droplets 13 in an embodiment of the invention can avoid the need for a pre-pulse to heat and shape the droplets prior to the main plasma forming pulse as has been used in some prior designs.

Another mechanism for pre-heating fuel droplets 13 in an embodiment of the invention is partial absorption of first radiation from pulses aimed at earlier droplets in the droplet train. For the most part of the trajectory 11, droplets 13 of fuel are within the shadow of the aperture in mirror 50 through which the trajectory 11 passes. However, by appropriate selection of the rate of convergence of the first radiation it can be arranged that approaching fuel droplets 13 are partially within converging beam 51 in advance of reaching the primary focus and are therefore partially irradiated by pulses aimed at droplets further ahead in the pulse train.

Tip 71 of heat storage element 70 is illustrated as having a conical shape at its lower end. Other shapes are possible, including cones with more than one cone angle, cones with flattened points (truncated cones), dome shapes of various types including shapes with different radii of curvature, concave shapes whether inverted cones or curved, flat tops, knurled cups.

In a variation of the fourth embodiment, the heat storage element 70 is maintained at a lower temperature, e.g. at or slightly above the melting point of the fuel. A cooling system (not shown in the Figure) can be provided to maintain the desired temperature. In an embodiment, the cooling system for the heat storage element 70 circulates a cooling medium, e.g. water, through conduit within or in thermal contact with heat storage element 70. The cooling medium can be supplied to the heat storage element 70 and removed therefrom by conduits located within exhaust duct 23 or in the shadow thereof. In this variation of the fourth embodiment, the heat storage element 70 does not function to heat approaching debris particles 13 but rather presents a shape that causes the debris particle to flatten into a disc or pancake shape in the surface of the heat storage element. This again serves to present a larger target to the first radiation so as to increase energy absorption.

In either variation of the fourth embodiment, the heat storage element can serve to increase the effective size of the fuel droplet by a factor of 2 or 3 or more. In an embodiment, an initial droplet of 30 μm diameter has its cross section in a plane perpendicular to the optical axis of the first radiation increased to 100 μm or more.

Figure 10:
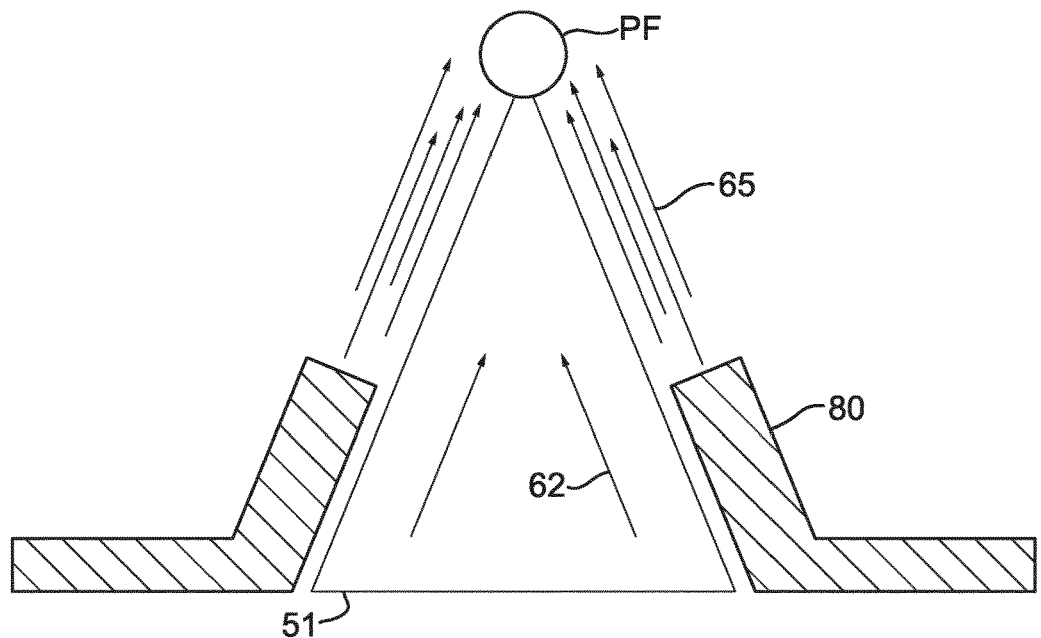
FIG. 10 depicts gas flow in a source collector apparatus of an embodiment of the invention.
Figure 11:
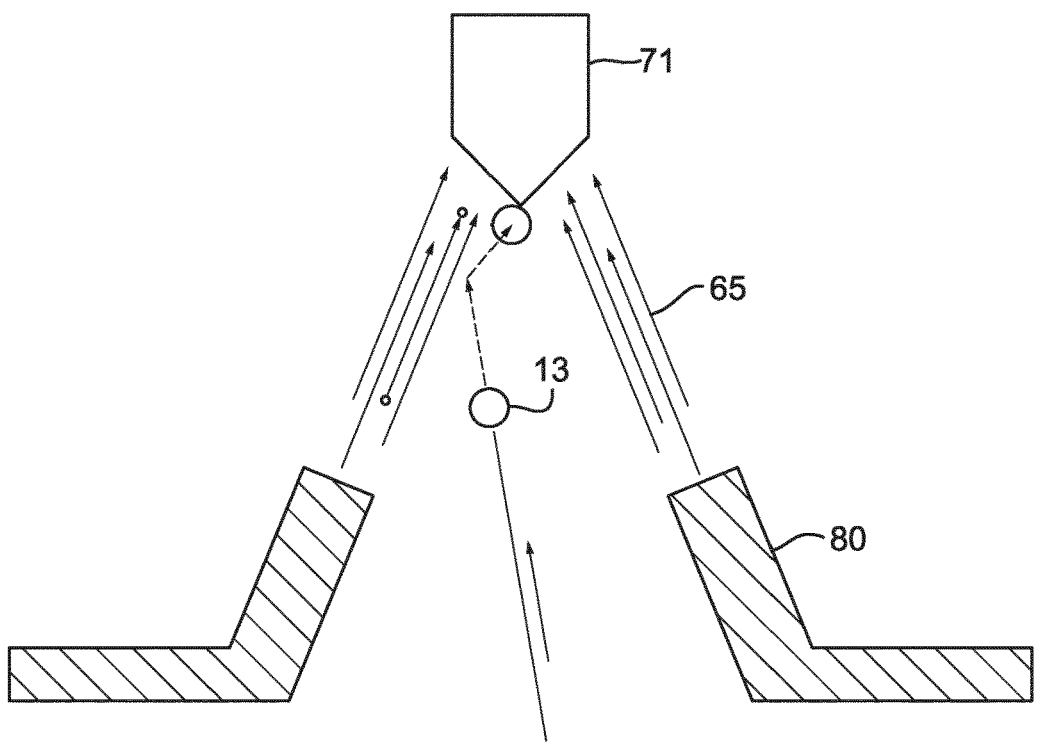
FIG. 11 depicts the effect of gas flow in a source collector apparatus of an embodiment of the invention on fuel droplets.

In a fifth embodiment of the invention depicted in FIGS. 10 to 13, the conical wall 30 is modified to provide an additional gas flow for controlling the trajectory of fuel droplets and the movement of plasma debris. As shown in FIG. 10 a nozzle member 80 replaces or is incorporated in the conical wall 30. Nozzle member 80 is supplied with buffer gas and has at least one nozzle aperture arranged to create a gas flow 65 directed toward primary focus PF. As shown in FIG. 11 gas flow 65 can correct the trajectory of a droplet 13 that has deviated from the optimal trajectory and deliver it to the primary focus or onto tip 71 of the heat storage element 70. It will be appreciated that the nozzle member 80 can be employed in any of the above described embodiments.

Figure 12:
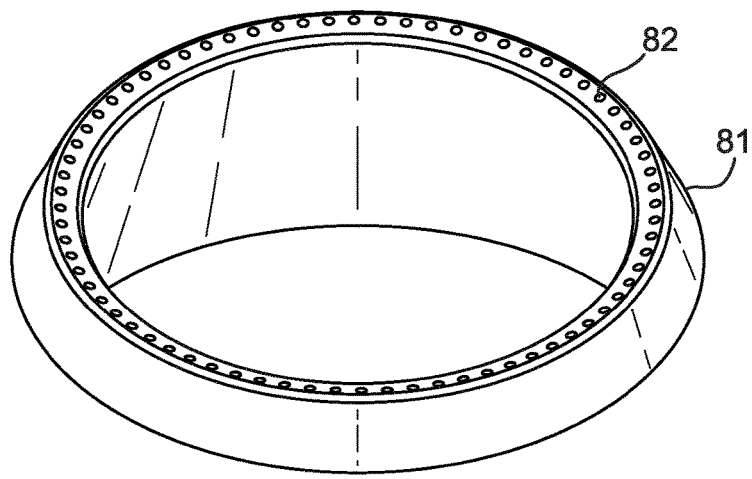
FIG. 12 depicts a nozzle unit of a source collector apparatus of an embodiment of the invention.
Figure 13:
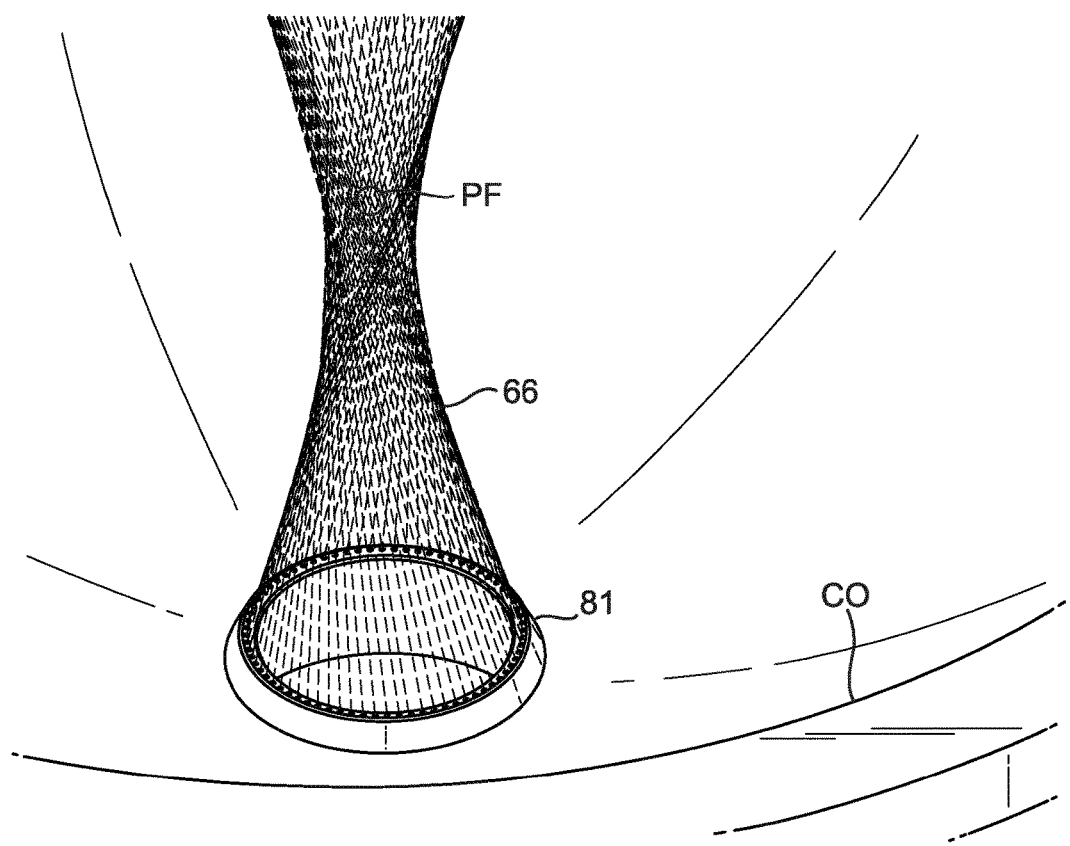
FIG. 13 depicts gas flow in a source collector apparatus using the nozzle unit of FIG. 12.

A variation of the nozzle member is shown in FIGS. 12 and 13. Nozzle member 81 comprises a conical ring having a plurality of apertures 82 spaced around its upper surface. Nozzles 82 are arranged to generate respective gas jets 66 that are aimed not exactly at the primary focus PF but at respective points slightly to one side of it and arranged in a ring around the primary focus. The gas jets 66 are oblique to the optical axis of the first radiation. As shown in FIG. 13 this sets up a vortex flow around the primary focus which serves both to direct fuel droplets toward the primary focus and debris into the debris trap 20 (not shown). A vortex flow can be used alternatively or in addition elsewhere in the radiation source, e.g. in gas flow 63 to protect the collector, and can be established by suitably directed nozzles and/or vanes. For example, tangentially directed nozzles can be provided around the perimeter of the collector and supplied with buffer gas.

An embodiment of the invention is a radiation source comprising a heat storage element having a fuel conduit therein, the fuel conduit having a fuel exit aperture in a target surface of the heat storage element. A fuel supply is configured to supply fuel to the fuel conduit so that it exits through the fuel exit aperture. A beam guiding system is configured to direct first radiation onto the fuel that exits through the fuel exit aperture, the first radiation causing the fuel to form a plasma that emits second radiation. A collector is configured to collect the second radiation and direct the second radiation into an exposure radiation beam. With this arrangement, the fuel supplied through the fuel conduit is preheated by the heat that has accumulated in the heat storage element so that less energy is required to form a plasma. The heat storage element is heated by waste heat from the first radiation and/or from condensing plasma. A radiation source according to the invention is therefore more efficient than prior art apparatus. Also, the fuel exiting the fuel exit aperture is at a known, fixed position which grateful simplifies targeting of the first radiation onto the fuel.

In a variation of the above embodiment, the fuel supply comprises a solid fuel feed device for feeding a solid fuel member into the fuel conduit. For example, the solid fuel member can be a tin wire. A solid fuel feed device can easily be configured to supply fuel accurately at a desired rate.

In a variation of the above embodiments, the fuel conduit includes a buffer chamber in which fuel in a fluid state can accumulate. The buffer chamber allows fluid fuel, e.g. a vapor or liquid, to accumulate in order to ensure that it reaches a desired temperature and can assist in ensuring that the fuel exits the fuel exit aperture at the desired rate.

In a variant of the above embodiment, the target surface of the heat storage element is convex or concave. The shape of the target surface can be determined in order to control the excited fuel and its subsequent removal. A concave surface can assist in localizing a mist or vapor of fuel prior to excitation. A convex surface can assist in guiding removal of the used fuel.

In a variant of the above embodiment, the beam guiding system is configured to focus the first radiation at a first focal point that is spaced away from the target surface. This arrangement ensures that a localized plasma is generated at a point selected to ensure maximum collection of the second radiation.

In a variant of the above embodiment, the heat storage element is provided with at least one through-hole, at least one fin and/or at least one groove in a surface other than the target surface in order to assist in controlling the flow of gas around the heat storage element. The through-hole, fin or groove can assist in transfer of heat to a gas flowing around the heat storage element in order to ensure that the heat storage element is maintained at a desired temperature.

Figure 14:
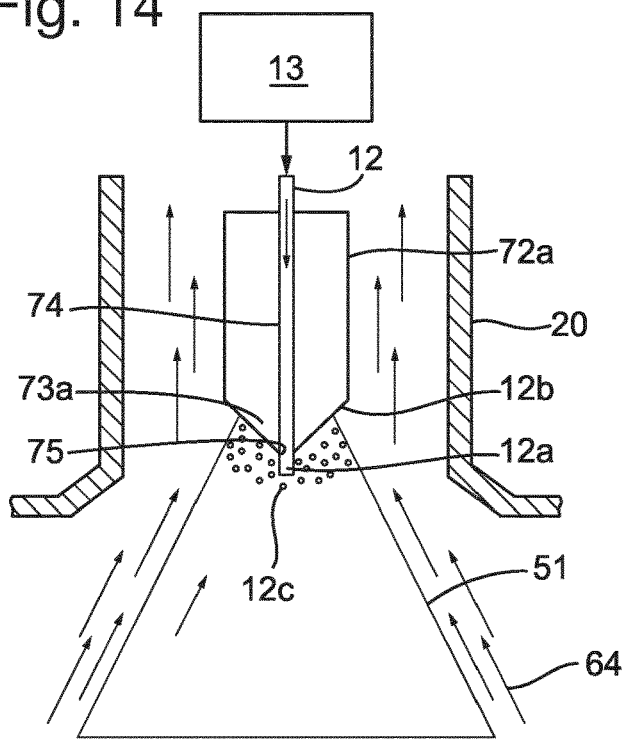
FIG. 14 depicts principal components of another source collector apparatus according to an embodiment of the invention.

FIG. 14 is a schematic diagram of a specific example of the above embodiment.

The heat storage element 72a is located within debris trap 20, which is generally the same as in previous embodiments and therefore is not described further in detail. Other components that are also similar to earlier embodiments are not described again. Heat storage element 72a is elongate and tapered towards a first end, the lower end in the figure, to form a target surface 73a which is convex. A conduit 74 is provided through heat storage element 72a and forms a fuel exit aperture 75 in the target surface 73a. A fuel supply 13 supplies a fuel 12 to the conduit 74 at a desired rate. The fuel 12 may be supplied to the fuel conduit in the form of a solid, e.g. a tin wire or other member. The fuel supply 13 can take the form of a spooler which supplies the tin wire at an accurately controlled rate.

As the fuel passes through conduit 74 it is heated by the heat storage element 72a. The fuel 12a exiting fuel exit aperture 75 can be still solid or may be fluid, e.g. liquid or vapor. The fuel exiting through fuel exit aperture 75 is further heated by first radiation 51 which is directed onto it by a beam guiding system (not shown) so as to form a mist or vapor 12c, if not already a vapor, and then a plasma. First radiation may be pulsed radiation provided by a $CO_2$ laser as is known in the art. In this embodiment it is not necessary to make the fuel exit the fuel exit aperture in synchronism with pulses of the first radiation. A continuous flow of fuel can be used.

The beam guiding system can be configured to focus the first radiation onto the target surface 73a of heat storage element 72 or to a first focus that is spaced apart from the target surface 73a. Focusing the first radiation on a point spaced away from the target surface can assist in ensuring that the plasma of the fuel forms at a desired position in space. Recombination of electrons and ions in the plasma results in the emission of radiation, including EUV radiation at a desired wavelength. Having the plasma formed at a static position assists in collection of the second radiation emitted by the plasma and ensuring uniform and consistent illumination of a target such as a patterning device.

A conical flow 64 of gas, e.g. hydrogen, is provided to assist in confining the plasma and to guide debris generated by the plasma into debris trap 20. Gas flow 64 can be provided by the same arrangements as described above.

During operation of the device, the heat storage element 72a is heated by absorption of energy from the first radiation 51 and from the fuel vapor and plasma. A layer of condensed fuel 12b may form on the target surface 73a also transferring heat to the heat storage element 72a. The heat storage element is cooled by the flow of gas over its surfaces and by radiation. There may also be a cooling effect due to the evaporation of fuel from the surface of the heat storage element. The rate of cooling is determined and controlled, including if necessary by the addition of extra cooling systems, so that the heat storage element maintains a predetermined temperature during operation. The predetermined temperature of the heat storage element is desirably above the melting point of the fuel (e.g. above about 500 K), more desirably above the vaporization point of the fuel (e.g. above about 3000 K). The heat storage element is therefore desirably made of a material with a very high melting point, e.g. tungsten or tantalum, but other materials, such as molybdenum, titanium or platinum, can be used.

The heat storage element is desirably made of a material with a high thermal conductivity, e.g. greater than about 100 W/mK. Since the heat storage element will be at a very high temperature in a hydrogen environment erosion is possible. Coatings may be applied to protect the heat storage element.

Debris from the fuel is swept into the debris trap 20 by gas flow 64 and removed. However, condensed fuel 12b on the surface of the heat storage element may undergo bubbling or spitting due to the presence of the gas. This phenomenon is particularly observed with liquid tin in a hydrogen atmosphere. The spitting of the fuel can be advantageous in creating a mist or vapor to be excited to plasma by the first radiation. Such a mist or vapor may form a better target for the first radiation because it does not present a reflective surface that might reflect a significant amount of the first radiation. Such reflection can be a particular problem if the reflected radiation is directed back into the source of the first radiation. The rate of supply of the fuel can be determined to take into account that some fuel that is excited to plasma may re-condense on the heat storage element then be vaporized again.

Figure 15:
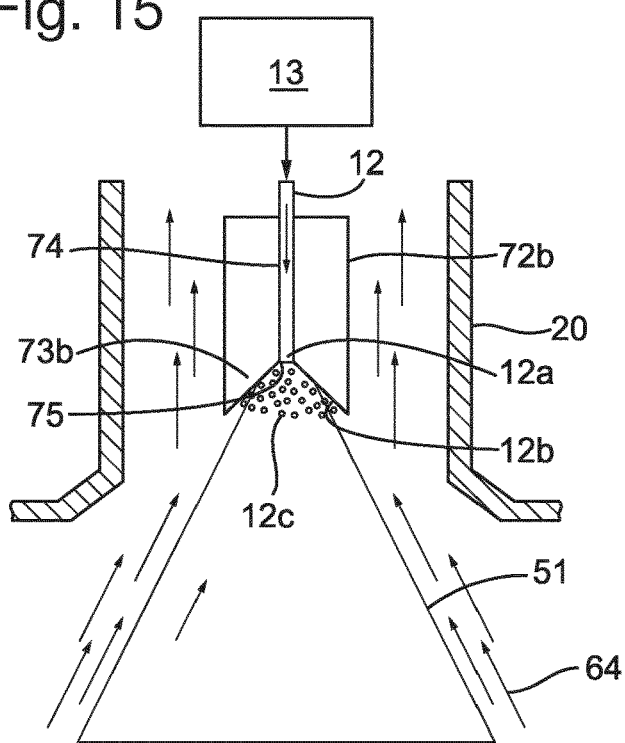
FIG. 15 depicts principal components of another source collector apparatus according to an embodiment of the invention.

FIG. 15 is a variant of the embodiment shown in FIG. 14 which differs only in that the target surface 73b of heat storage element 72b is made concave to assist in localization of the fuel exiting the fuel exit aperture 75. Otherwise, the embodiment of FIG. 15 is the same as the embodiment of FIG. 14.

Figure 16:
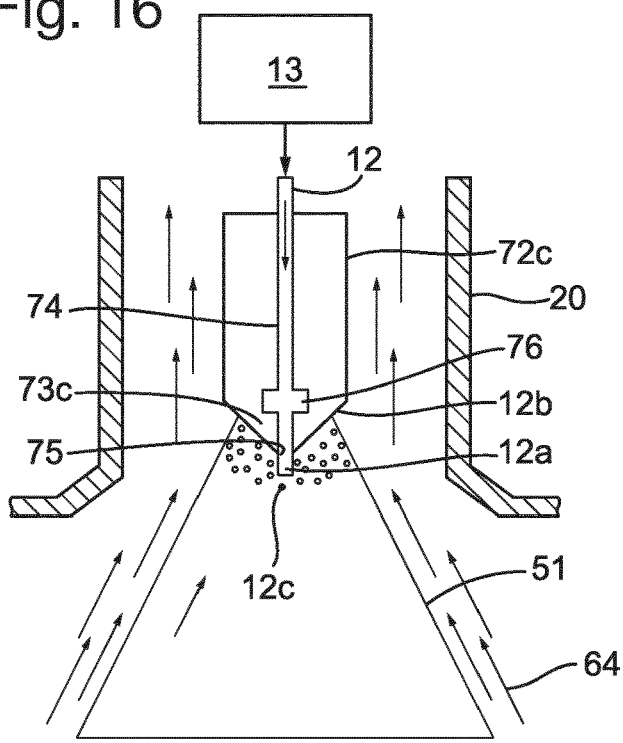
FIG. 16 depicts principal components of another source collector apparatus according to an embodiment of the present invention.

FIG. 16 depicts a further specific example of the above embodiment which is essentially the same as the embodiment of FIG. 14 except that a buffer chamber 76 is provided in the fuel conduit 74 of heat storage element 72c. Buffer chamber 76 can ensure that the fuel 12 reaches a desired temperature before exiting the fuel exit aperture 75 and can assist in ensuring that the rate of fuel exiting the fuel exit aperture is constant. The shape, size and location of buffer chamber 76 can be determined in accordance with the expected operating temperature of the heat storage element and the required rate of heat flow therethrough. The embodiment of FIG. 16 has a convex target surface 73c.

Figure 17:
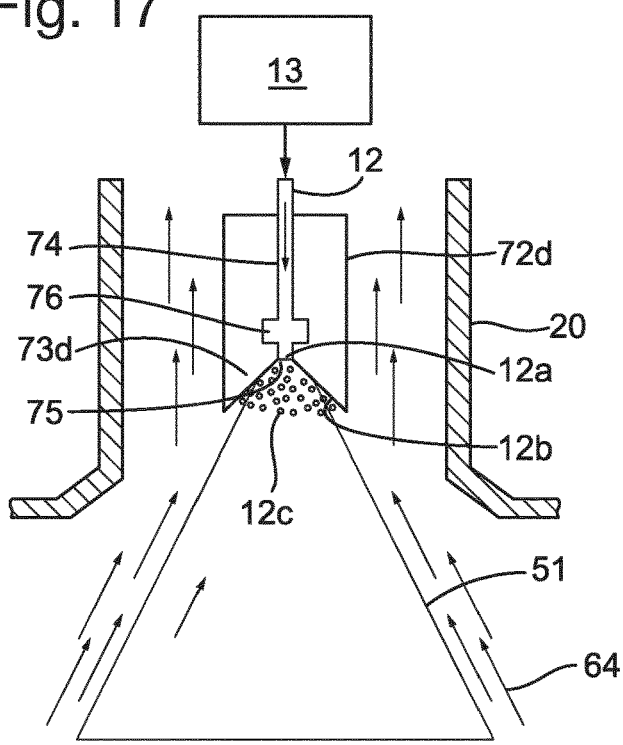
FIG. 17 depicts principal components of another source collector apparatus according to an embodiment of the present invention.

FIG. 17 depicts a further variant which is essentially the same as the embodiment of FIG. 15 but provided with the buffer chamber 76 of the embodiment of FIG. 16. Thus heat storage element 72c has a concave target surface 73c.

Figure 18:
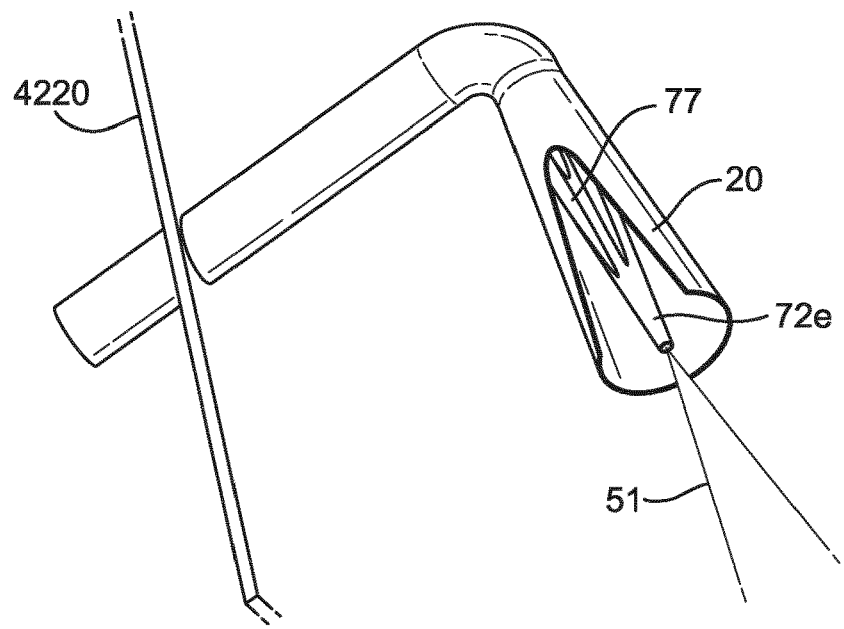
FIGS. 18 and 19 are partially cut away schematic views depicting principal components of another source collector apparatus according to an embodiment of the invention.
Figure 19:
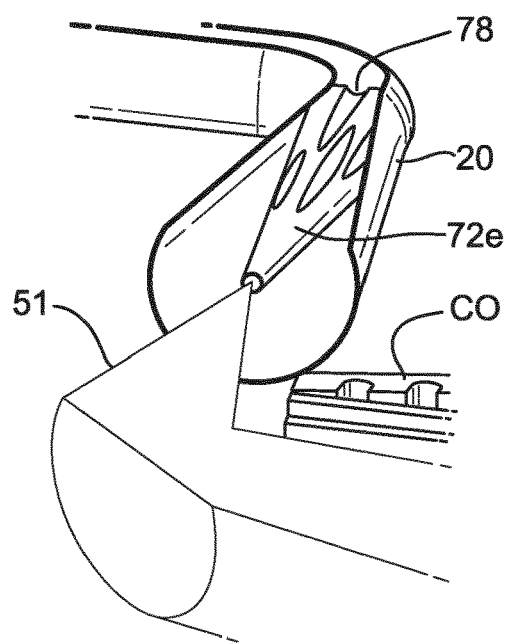

FIGS. 18 and 19 depict a further specific example of the above embodiment showing some parts of the apparatus in partial cut away. Heat storage element 72e is generally conical having a flat tip forming the target surface. The tip may also be concave or convex. One or more grooves 77 is provided in the curved side surface of heat storage element 72e in order to guide the flow of gas 64 around heat storage element 72e. One or more through-holes 78 is also provided for the same purpose. Through-hole 78 extends generally parallel to the axis of heat storage element (72e) from the conical side surface of heat storage element 72e to a rear surface thereof. The through-holes and grooves increase the surface area of the heat storage element over which it can exchange heat with the flow of gas 64.

Variations on the embodiments of FIGS. 14 to 19 are possible. The shape and size of the heat storage element can be different than illustrated. Multiple heat storage elements can be provided. Multiple fuel conduits can be provided in a single heat storage element. A fuel conduit can be branched or forked to provide multiple inputs or exits. A fuel conduit may have a complex on sinuous path in the heat storage element to increase the time spent by the fuel in the heat storage element if necessary to ensure it reaches a desired temperature.

The heat storage element can be manufactured by conventional techniques such as casting and milling. The fuel conduit and any through-holes can be drilled. If complex internal voids are desired the heat storage element can be made in several parts which are welded or fused together. Additive manufacturing techniques can be used.

As will be appreciated, any of the above described features can be used with any other feature and it is not only those combinations explicitly described which are covered in this application.

A radiation source according to the invention can be used for other purposes than lithography and with other apparatus that a lithographic apparatus. For example a radiation source according to the invention can be used as an illumination source for a metrology or inspection apparatus.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. In the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

An embodiment of the invention may be applied to substrates with a width (e.g., diameter) of 300 mm or 450 mm or any other size.

The descriptions above are intended to be illustrative, not limiting. Thus, it will be apparent to one skilled in the art that modifications may be made to the invention as described without departing from the scope of the claims set out below.

The invention claimed is:

1. A radiation source comprising:
a fuel dispenser configured to emit fuel along a fuel trajectory having an axis extending in a first direction, the fuel dispenser comprising an outlet opening operative to emit the fuel along the trajectory;
a beam guiding system configured to direct first radiation in a first beam to a first focal point located on the fuel trajectory, wherein fuel at the first focal point is excited by the first radiation into a plasma that emits second radiation and an axis of the first beam extending in a second direction has a directional component in the first direction; and
a collector arranged to collect the second radiation and direct it in a second beam to a second focal point, at least part of the collector arranged between the outlet opening and the first focal point and between at least part of the beam guiding system and the first focal point such that the fuel passes the at least part of the collector toward the first focal point and the first beam passes the same at least part of the collector toward the first focal point.

2. A radiation source according to claim 1, wherein the beam guiding system is arranged to direct the first radiation to converge on the first focal point and an end part of the fuel trajectory is within the first beam.

3. A radiation source according to claim 1, wherein the end part of the fuel trajectory is substantially collinear with the optical axis of the first beam.

4. A radiation source according to claim 1, wherein the fuel trajectory and the first radiation pass through a same aperture in the collector.

5. A radiation source according to claim 1, wherein the beam guiding system comprises a mirror oriented obliquely to the fuel trajectory.

6. A radiation source according to claim 1, wherein the second beam is substantially parallel to the first beam.

7. A radiation source according to claim 1, further comprising a debris trap located behind the first focal point as seen from the collector.

8. A radiation source according to claim 7, wherein the debris trap is located substantially within a volume not traversed by second radiation directed by the collector to the second focal point.

9. A radiation source according to claim 1, further comprising a heat storage element located on the fuel trajectory past the first focal point.

10. A radiation source according to claim 9, wherein the heat storage element is located within a debris trap.

11. A radiation source according to claim 9, further comprising a temperature control system arranged to control the temperature of the heat storage element to be higher than a melting point of the fuel.

12. A radiation source according to claim 1, further comprising a wall provided on the collector around an aperture therein and extending toward the first focal point.

13. A radiation source according to claim 1, wherein the fuel trajectory has a skyward directional component.

14. A radiation source according to claim 1, wherein the fuel dispenser is a droplet generator.

15. A radiation source according to claim 14, wherein the droplet generator is arranged to generate droplets of molten tin.

16. A lithographic apparatus comprising:
a radiation source according to claim 1;
an illuminator arranged to direct the second radiation onto a patterning device;
a support table arranged to support a patterning device; and
a projection system arranged to project radiation patterned by the patterning device onto a substrate.

17. A radiation source comprising:
a fuel dispenser configured to emit fuel along a fuel trajectory;
a beam guiding system configured to direct first radiation in a first beam to a first focal point located on the fuel trajectory, wherein fuel at the first focal point is excited by the first radiation into a plasma that emits second radiation;
a concave collector arranged to collect the second radiation and direct it to a second focal point, wherein the collector has an aperture through which the first beam is directed; and
a solid wall located at the concave side of the collector, the wall surrounding the aperture and extending towards the first focal point, the wall having an aperture configured to pass the first beam from the aperture of the collector toward the first focal point, and the wall further having an opening, defined in a surface of the wall, configured to provide gas toward the first focal point.

18. A lithographic apparatus comprising:
a radiation source according to claim 17;
an illuminator arranged to direct the second radiation onto a patterning device;
a support table arranged to support a patterning device; and
a projection system arranged to project radiation patterned by the patterning device onto a substrate.

* * * * *